United States Patent [19]

Zwadlo et al.

[11] Patent Number: 5,342,720

[45] Date of Patent: Aug. 30, 1994

[54] COLOR PROOFING ELEMENT AND PROCESS FOR MAKING THE SAME

[75] Inventors: Gregory L. Zwadlo, Ellsworth, Wis.; Roger I. Krech, St. Paul, Minn.

[73] Assignee: Minnesota Mining and Manufacturing Company, St. Paul, Minn.

[21] Appl. No.: 54,867

[22] Filed: Apr. 28, 1993

[51] Int. Cl.$^5$ .............................................. G03G 5/147
[52] U.S. Cl. ........................................ 430/66; 430/132
[58] Field of Search .................................. 430/66, 132

[56] References Cited

U.S. PATENT DOCUMENTS

| | | |
|---|---|---|
| 3,140,175 | 7/1964 | Kaprelian . |
| 3,157,546 | 11/1964 | Cover ..................................... 156/231 |
| 3,337,340 | 8/1967 | Matkan . |
| 3,376,133 | 11/1964 | Roteman . |
| 3,612,677 | 10/1971 | Webster et al. . |
| 3,779,748 | 12/1973 | Mosehauser et al. .......... 430/132 X |
| 3,804,619 | 4/1974 | Mammino et al. . |
| 3,833,293 | 9/1974 | Serio et al. . |
| 3,847,642 | 11/1974 | Rhodes . |
| 3,862,848 | 1/1975 | Marley . |
| 4,049,448 | 9/1977 | Honjo et al. ...................... 430/66 X |
| 4,064,285 | 12/1977 | Mammino . |
| 4,066,802 | 1/1978 | Clemens . |
| 4,155,862 | 5/1979 | Mohn et al. . |
| 4,157,219 | 6/1979 | Ohta et al. . |
| 4,256,823 | 3/1981 | Takahashi et al. ............. 430/132 X |
| 4,275,136 | 6/1981 | Murasawa et al. ................. 430/117 |
| 4,337,303 | 6/1982 | Sahyun et al. ........................ 430/11 |
| 4,477,548 | 10/1984 | Harasta et al. ........................ 430/14 |
| 4,510,223 | 4/1985 | Kuehnle et al. ....................... 430/44 |
| 4,515,882 | 5/1985 | Mammino et al. ..................... 430/58 |
| 4,565,760 | 1/1986 | Schank ................................. 430/66 |
| 4,600,669 | 7/1986 | Ng et al. ............................... 430/47 |
| 4,600,673 | 7/1986 | Hendrickson et al. ............... 430/66 |
| 4,721,663 | 1/1988 | Johncock et al. .................... 430/65 |
| 4,725,867 | 2/1988 | Ng et al. . |
| 4,752,549 | 6/1988 | Otsuka et al. ........................ 430/58 |
| 5,066,559 | 11/1991 | Elmasry et al. ..................... 430/111 |
| 5,240,801 | 8/1993 | Hayashi et al. ................. 430/132 X |

FOREIGN PATENT DOCUMENTS

498535A1  1/1992  European Pat. Off. .

*Primary Examiner*—Roland Martin
*Attorney, Agent, or Firm*—Gary L. Griswold; Walter N. Kirn; Gregory A. Evearitt

[57] ABSTRACT

A proofing element containing: (a) a photoconductive layer on an electrically conductive substrate; and (b) overlaying the photoconductive layer, a removable dielectric layer containing thermoplastic polymeric resinous particles which have steric stabilizer groups adhered to the surfaces of said polymeric particles, said steric stabilizer groups being in coordinated association with a charge directing moiety and said charge directing moiety having a charge dissipating agent in association therewith.

A process for applying a removable dielectric layer to a photoconductive substrate comprising the steps of: (a) applying an organosol to a photoconductive substrate, the organosol comprising: a carrier liquid having a dispersion therein of thermoplastic polymeric resinous particles which have steric stabilizer groups adhered to the surfaces of said polymeric particles, said steric stabilizer groups being in coordinated association with a charge directing moiety and said charge directing moiety having a charge dissipating agent in association therewith; and (b) removing the carrier liquid.

10 Claims, No Drawings

COLOR PROOFING ELEMENT AND PROCESS FOR MAKING THE SAME

BACKGROUND TO THE INVENTION

1. Field of the Invention

This invention relates to a color proofing element and more particularly, it relates to a photoconductive layer coated with a releasable dielectric layer. This invention also relates to a process for making the inventive color proofing element.

2. Background of the Invention

Multicolor toner images produced by successive toner transfer from a photoconductor to a single receptor are well known in the art, both for powder toners with constituents intended to improve resolution on transfer and for use with magnetic brush development (U.S. Pat. No. 3,833,293). U.S. Pat. No. 3,612,677 discloses a machine designed to provide good registration when using successive color image transfer and U.S. Pat. No. 3,804,619 discloses special powder toners to overcome difficulties toners have in three color successive transfer.

U.S. Pat. No. 3,847,642 discloses a method and apparatus for transferring and fixing images formed by electrostatographic imaging techniques. A thin film of viscous material is applied to an imaging member prior to or after forming an electrostatic latent image thereon. The latent image is developed with electroscopic marking material and the resulting developed image is transferred by contact to a recording medium. A portion of the viscous material is also transferred to the recording medium with the image and is subsequently solidified, thereby fixing the image to the recording medium.

The production of multi-colored images by overlaying toned images on a photoconductor surface is also known. For example, U.S. Pat. No. 3,337,340 discloses liquid developers designed to minimize the "bleeding away of charge on the photoconductor surface" which occurs when recharging of an already toned surface is attempted. U.S. Pat. Nos. 4,155,862 and 4,157,219 disclose liquid toner formulations and apparatus for producing multicolor composite toned images on a photoconductor surface. U.S. Pat. No. 4,275,136 emphasizes the difficulties in ensuring that overlaid toner layers on a photoconductor adhere to one another. The addition of zinc or aluminum hydroxides coated on the colorant particles is used to solve the problem.

Many methods are used to aid the efficient transfer of toner from a photoconductor surface after toner development to a receptor sheet. U.S. Pat. No. 3,157,546 discloses overcoating a developed toner image while it is still on the photoconductor. A liquid layer having a concentration of about 5% of a film-forming material in a solvent is used at between 10 and 50 microns wet thickness. After drying, transfer is carried out to a receptor surface which has a mildly adhesive surface.

U.S. Pat. No. 4,066,802 discloses the transfer of a multi-toned image from a photoconductor, first to an adhesive carrier sheet and then to a receptor. The second stage involves the application of heat and pressure with a "polymeric or plasticizing sheet" between the image on the carrier sheet and the receptor surface. U.S. Pat. No. 4,064,285 also uses an intermediate carrier sheet which has a double coating on it comprising a silicone release layer underneath and a top layer which transfers to the final receptor with the multicolor image and fixes it under the influence of heat and pressure.

U.S. Pat. No. 4,337,303 discloses methods of transferring a thick (high optical density) toned image from a photoconductor to a receptor. High resolution levels of the transferred images are claimed (200 l/mm). It is required to dry the liquid toned image and encapsulate the image in a layer coated on the receptor. Curing of the encapsulating layer is required with some formulations. The materials of this layer are chosen to have explicit physical properties which provide not only complete transfer of the thick toner image but also ensure encapsulation of it.

U.S. Pat. No. 4,477,548 teaches the use of a protective coating over toner images. The coating is placed on the final image and is not involved in any image transfer step. The coating may be a multifunctional acrylate, for example.

Transfer of certain types of composite multi-toned images is disclosed in the art. U.S. Pat. No. 3,140,175 discloses depositing microbeads containing a dye and a photoconductor on one electrode; exposing them through a colored original; and then applying a field between a first and second electrode thereby causing separation of charged and uncharged beads and transfer of the colored image to a receptor surface at the second electrode. U.S. Pat. No. 3,376,133 discloses laying down different colored toners sequentially on a photoconductor which is charged only once. The toners have the same charge as that on the photoconductor and replace the charge conducted away in image areas. However, it is disclosed that subsequent toners will not deposit over earlier ones. The final image of several toners is transferred to a receptor and fixed. U.S. Pat. No. 3,862,848 discloses normal sequential color separation toned images transferred to an intermediate receptor (which can be a roller) by "contact and directional electrostatic field" to give a composite multi-toned image. This composite image is then transferred to a final receptor sheet by contact and a directional electrostatic field.

U.S. Pat. No. 4,600,669 describes an electrophotographic proofing element and process in which successive liquid toned color images are formed on a photoconductive support. The composite image is then transferred to a receptor layer. The photoconductive layer has a releasable dielectric support coated thereon which may comprise a polymeric overcoat on the photoconductive layer which is transferred with the composite image. See also U.S. Pat. No. 4,725,867.

U.S. Pat. No. 4,515,882 describes an electrophotographic imaging system using a member comprising at least one photoconductive layer and an overcoating layer comprising a film forming continuous phase of charge transport molecules and charge injection enabling particles.

U.S. Pat. No. 4,565,760 describes a photoresponsive imaging member comprising a photoconductor layer and, as a release protective coating over at least one surface, a dispersion of colloidal silica and a hydroxylated silsesquioxane in alcohol medium.

U.S. Pat. No. 4,721,663 describes an improved enhancement layer used in electrophotographic devices between a top protective layer and the photoconductor layer.

U.S. Pat. No. 4,752,549 describes an electrophotographic receptor having a protective layer composed of a thermosetting silicone resin and a polyvinyl acetate resin.

U.S. Pat. No. 4,510,223 describes a multicolor electrophotographic imaging process. A general description of transfer of the toned image to an adhesive receptor is disclosed at column 15, lines 21–40.

As is known in the electrophotographic arts, toners are used to develop a latent electrostatic image produced on a photoconductive surface.

EPA Publication No. 498,535 A 1 (foreign counterpart to Assignee's copending U.S. application Ser. No. 07/652,572, filed Feb. 8, 1991) discloses a liquid electrophotographic toner having a coordinated association of steric stabilizer and charge directing moiety having a monovalent alkali metal or ammonium cation bonded thereto. The toner employs pigment particles.

U.S. Pat. No. 5,066,559 discloses liquid toners for developing electrophotographic images containing dispersed toner particles which are based on a polymer with multiple characteristics. These particles contain a thermoplastic resinous core with a glass transition temperature ($T_g$) below room temperature which is chemically anchored to an amphiphatic copolymer steric stabilizer containing covalently attached groups of organic acid-containing moieties having a pKa less than 4.5 which in turn are chemically bonded to metal soap-containing compounds derived from organic acids having a pKa greater than 4.5. The toner particles so formed have advantageous properties of high charge/mass and good charge and dispersion stability.

SUMMARY OF THE INVENTION

In accordance with the present invention, it has now been discovered that the association of charge dissipating agents such as, for example, sodium or ammonium stearate or the like, with a charge directing moiety such as, for example, a metal soap, in an organosol results in a material which can coalesce into a continuous resinous film on a photoreceptor and permits an electrostatic latent image to discharge during imaging.

In one embodiment, the present invention provides a proofing element comprising:
(a) a photoconductive layer on an electrically conductive substrate; and
(b) overlaying the photoconductive layer, a removable dielectric layer comprising thermoplastic polymeric resinous particles which have steric stabilizer groups adhered to the surfaces of the polymeric particles, said steric stabilizer groups being in coordinated association with a charge directing moiety and said charge directing moiety having a charge dissipating agent in association therewith.

In a preferred embodiment, the charge dissipating agent is an alkali metal or ammonium cation.

In another embodiment, the present invention provides a process for applying a removable dielectric layer to a photoconductive substrate comprising the steps of:
(a) applying an organosol to a photoconductive substrate, the organosol comprising: a carrier liquid having a dispersion therein of thermoplastic polymeric resinous particles which have steric stabilizer groups adhered to the surfaces of said polymeric particles, said steric stabilizer groups being in coordinated association with a charge directing moiety and said charge directing moiety having a charge dissipating agent in association therewith; and
(b) removing the carrier liquid.

In a preferred embodiment, the organosol is applied to the photoconductive substrate by electrophoretic deposition. As used herein:
a "charge dissipating agent" is a material in a polymeric layer which allows charge conduction through an otherwise dielectric polymeric layer to effectively dissipate any voltage difference across the polymer layer;
an "organosol" is a colloidal dispersion of a polymeric resin in an organic solvent; and
"in association with" refers to a mixture or chemical coordination of two components.

Other aspects of the present invention, as well as various advantages and benefits thereof, are apparent from the detailed description, examples, and claims.

DETAILED DESCRIPTION OF THE INVENTION

The present invention involves the application of a removable dielectric layer to the surface of a photoconductive substrate. The organosol comprises a carrier liquid having a dispersion therein of thermoplastic polymeric resinous particles which have steric stabilizer groups adhered to the surfaces of the polymeric particles. The steric stabilizer groups are in coordinated association with a charge directing moiety. A charge dissipating agent is in association with the charge directing moiety.

The present invention employs any known photoconductor, inorganic or organic. Non-limiting examples of inorganic photoconductors include selenium, selenium alloys, zinc oxide and lead oxide dispersions, cadmium sulfide, and antimony sulfide. Non-limiting examples of organic photoconductors include arylamines, polyarylalkanes, non-ionic cycloheptenyl compounds, hydrazones, pyrazolines, phthalocyanines, and compounds containing a =N—N= nucleus, etc. The photoconductor may comprise a bilayer structure having separate charge generating and charge transport layers, or it may comprise a monolayer construction having sensitizer and transport materials contained in one layer.

The photoconductor is supported on an electrically conductive support member such as brass, aluminum, nickel, steel, or the like. The support may be of any convenient thickness, rigid or flexible and may be in any desired form such as a sheet, web, plate, cylinder, drum, or the like. It may also comprise other materials such as metallized paper, plastic sheets coated with a thin layer of metal such as copper iodide or aluminum, or glass coated with a thin layer of tin oxide or aluminum. The electrically conductive support can be transparent, translucent, or opaque. The photoconductor may also be coated with a silicone release coating to increase the efficiency of transfer of the toned organosol film (described later herein). Such release coatings are described in U.S. Pat. No. 4,600,673, incorporated herein by reference.

The photoconductive layer is coated with an overlayer of an organosol. The organosol comprises a dispersion (i.e., a disperse phase) of thermoplastic polymeric resinous particles in a carrier liquid (i.e., a continuous phase). The particles have steric stabilizers in coordinated association with a charge directing moiety and the charge directing moiety has a charge dissipating agent in association therewith.

Carrier Liquids

Carrier liquids used for the liquid toners of this invention are chosen from non-polar liquids, preferably hydrocarbons, which have a resistivity of at least $10^{11}$ ohm-cm and preferably at least $10^{13}$ ohm-cm; a dielectric constant less than 3.5;and a boiling point in the range 140° C. to 200° C. Aliphatic hydrocarbons such as hexane, cyclohexane, iso-octane, heptane, and isododecane, and commercially available mixtures such as Isopar® G, H, K, and L, and Norpar® (available from Exxon Chemical Company) are suitable. However, aromatic hydrocarbons, fluorocarbons, and silicone oils may also be used.

The Polymer Dispersion

The polymer dispersion is made of a thermoplastic colloidal polymer dispersion that is insoluble or substantially insoluble in the carrier liquid. The polymer dispersion is comprised of a copolymer further comprising a core polymer and a steric stabilizer polymer. It is prepared by copolymerization of a core monomer with a steric stabilizer polymer.

Monomers suitable for the core polymer are well known to those skilled in the art. Representative examples include ethyl acrylate, methyl acrylate, and vinyl acetate.

The steric stabilizer polymer is a graft copolymer comprising two polymeric components and is prepared by the copolymerization of at least two monomers. The major component of the steric stabilizer polymer is soluble in the carrier liquid phase. The minor component is insoluble in the carrier liquid phase. These components may further contain anchoring groups, coordinating groups, and solubilizing groups. A steric stabilizer polymer is a material that stabilizes a polymer through its structural properties. It is to be differentiated, for example, from stabilizers that stabilize through electrostatic interactions.

The anchoring groups represent a minor proportion of the disperse phase. The anchoring groups function to provide a covalent link between the core polymer portion of the polymer particle and the carrier liquid-soluble component of the steric stabilizer portion of the polymer particle. The anchoring groups are further reacted with functional groups of an ethylenically unsaturated compound to form a graft copolymer stabilizer. The ethylenically unsaturated moieties of the anchoring groups can then be used in subsequent copolymerization reactions with the core monomer to prepare the final thermoplastic latex polymer.

The coordinating groups also represent a minor proportion of the disperse phase. The coordinating groups function to react with a polyvalent metal cation such as a cation of an acid-containing polyvalent metal soap to impart a permanent positive charge on the organosol particle.

The solubilizing groups contain portions that are soluble in the carrier liquid phase. They cover the surface of the final organosol polymer particle and function to stabilize the dispersion by preventing particles from approaching each other.

Preferred comonomers containing preferred functional groups are described in U.S. Pat. No. 4,946,753, incorporated herein by reference.

Upon deposition and heating, the layer of organosol polymer particles, in combination with the charge directing agent and charge dissipating agent of this invention, can coalesce into a continuous resinous film on the photoreceptor and permit the electrostatic latent image to discharge during the imaging cycle. This permits subsequent formation of superimposed latent electrophotographic images through the organosol polymer layer and allows the photoreceptor to be recycled, thus enabling another image to be overprinted (i.e., retoned) over the first image. In this manner, a full color proof can be prepared. In contrast, non-coalescent particles of the prior art, such as those described in U.S. Pat. No. 4,564,574, retain their shape even after being air dried on the photoreceptor. The points of contact are then few compared to the homogeneous or continuous film-forming organosol of the present invention. As a result, some of the charges are retained on the unfused particles, repelling the next toner deposition, and preventing another image from being overprinted or superimposed (i.e., retoned) over the first image. This reduces the formation of the latent electrostatic image and results in poor imaging, and in a poor proof.

It is preferred that the weight ratio of stabilizer polymer/(stabilizer polymer + core polymer) is 0.10 to 0.40 (i.e., 10% to 40 wt. %). It is also preferred that the core polymer have a $T_g$ below about 40° C. to allow fusing at or near room temperature. A core polymer having a $T_g$ greater than about 40° C. may be made to coalesce into a film near room temperature if the stabilizer polymer/(stabilixer polymer + core polymer) ratio is high enough. A weight ratio of stabilizer polymer/ (stabilizer polymer + core polymer) of between 0.20 to 0.80 (i.e., 20 wt. % to 80 wt. %) can give coalescence near room temperature with core $T_g$ values with a range of about 25° C. to 105° C.

The Charge Directing Moiety

The metal soaps used as charge directing moieties should be derived from polyvalent metals which form strong coordinate bonds with the chelating groups of the stabilizer. Preferred metal soaps include salts of fatty acids with a metal cation chosen from the group consisting of: $Al^{3+}$, $Ca^{2+}$, $Co^{2+}$, $Cr^{3+}$, $Fe^{2+}$, $Fe^{3+}$, $Zn^{2+}$, and $Zr^{4+}$. An example of a preferred acid-containing polyvalent metal soap is zirconium neodecanoate. It has a metal content of 12% by weight. Metal soaps of neodecanoic acid are sold under the name of Ten-Cem® and are available from OMG, Inc. (formerly Mooney Chemical Company, Cleveland, Ohio).

As noted above, the organosol containing coordinating groups reacts (chelates) with the metal soap to form charged particles. Although not wishing to be bound by theory, it is believed that polymer dispersions having pendant chelating groups attached to the soluble polymeric component of the particle react with metal soaps in the aliphatic-hydrocarbon liquids, such as those employed as carder liquids, to form metal chelate ligands on the surface of the dispersed particles.

The Charge Dissipating Agent

Preferably, the charge dissipating agent is a monovalent alkali metal cation or ammonium cation.

The monovalent alkali metal cation or ammonium cation should be present in the organosol as at least 0.01% on a molar basis as compared to the total of the metal soap in order to display useful beneficial results. Generally it is preferred to use between 0.01 and 15% on a molar basis compared to the metal of the acid-containing polyvalent soap. The most preferred range would be about 0.1 to 15% on a molar basis.

The materials which can be used to contribute the monovalent alkali metal cation or ammonium cation include, but are not limited to, monovalent alkali metal or ammonium carboxylates, sulfonates, carbonates, and hydroxides.

When using a monovalent carboxylate, it is to be incorporated into the organometallic charge directing compounds, such as metal soaps, and mixed well. The preferred monovalent carboxylate contains the following non-limiting groups sodium, lithium, potassium, or ammonium. The carboxylate functionality is comprised of groups having two to twenty carbon atoms. Examples of preferred monovalent carboxylates, sulfonates, carbonates and other monovalent metal additives include, but are not limited to, sodium stearate; lithium stearate; ammonium stearate; potassium octoate; and Aerosol OT-S (dioctyl ester of sodium sulfosuccinic acid).

The organosol is applied to the surface of the photoconductive substrate by any appropriate method such as electrophoretic deposition, dip coating, Meyer rod coating, reverse roll coating, or the like.

Coating is preferably accomplished by electrophoretic deposition. Electrophoretic deposition has specific advantages as it allows for the formation of a layer of controlled thickness and requires little drying. Electrophoretic deposition also allows the charged organosol to be deposited in an imagewise fashion if so desired. Electrophoretic deposition uses a gap electrode, typically spaced 200–1000 $\mu$m from the photoreceptor surface and electrically biased to 300–700 volts. A dilute dispersion (typically 0.3–4.0% solids) is pumped through the gap and the organosol polymer particles are electrophoretically deposited on the photoreceptor surface. A vacuum knife or an air knife is used to remove excess carrier liquid and a heater is then used to drive off residual solvent and coalesce the deposited organosol.

Optionally, fillers, extenders, anti-gloss, or matting materials such as $SiO_2$, $Al_2O_3$, waxes, or talc may be added to the organosol. These are particularly useful if a non-glossy finish is desired on the final print.

The following non-limiting examples further illustrate the present invention.

EXAMPLES

Preparation of the Organosol Polymer

The preparation of organosol polymers is described in U.S. Pat. No. 4,946,753, incorporated herein by reference. The preparation of a representative organosol polymer is illustrated by the preparation of a lauryl methacrylate/salicylate stabilizer having an ethyl acrylate core.

Preparation of a stabilizer containing salicylic acid groups

Preparation of stabilizer precurser.

In a 500 ml 2-necked flask fitted with a thermometer, and a reflux condenser connected to a $N_2$ source, a mixture of 95 g of lauryl methacrylate, 2 g of 2-vinyl-4,4-dimethylazlactone (VDM), 3 g of carboxyhydroxybenzylmethacrylate (CHBM), 1 g of azobisisobutyronitrile (AIBN), 100 g of toluene and 100 g of ethylacetate was introduced.

The flask was purged with $N_2$ and heated at 70° C. for 8 hours. A clear polymeric solution was obtained. An IR spectra of a dry film of the polymeric solution showed an azlactone carbonyl at 5.4 $\mu$m.

Reaction of stabilizer precursor prepared above with 2-hydroxyethylmethacrylate (HEMA)

A mixture of 2 g of HEMA, 1.5 g of 10% p-dodecylbenzene sulfonic acid (DBSA) in heptane and 15 ml of ethyl acetate was added to the polymeric stabilizer precursor solution prepared above. The reaction mixture was stirred at room temperature overnight. The IR spectra of a dry film of the polymeric solution showed the disappearance of the azlactone carbonyl peak, indicating the completion of the reaction of the azlactone with HEMA.

Ethyl acetate and toluene were removed from the stabilizer by adding an equal volume of Isopar ® G and distilling the ethyl acetate and the toluene under reduced pressure. The polymeric solution looked turbid. The polymer solution was filtered through Whatman #2 filter paper to collect the unreacted salicylic acid. There was no remaining solid on the filter paper, indicating that all the CHBM has been incorporated. The turbidity may have been due to the insolubility of the pendant salicylic groups.

Preparation of The Disperse Phase

To a 2L 2-necked flask fitted with a thermometer and a reflux condenser connected to a $N_2$ source, were introduced a mixture of 1200 ml of Isopar ® G, a solution of steric stabilizer prepared above, and containing 35 g of solid polymer; 1.5 g of AIBN; and 70 g of core monomer. As noted above, the core monomer can be ethyl acrylate, methyl acrylate, or other suitable monomers. The flask was purged with $N_2$ and heated at 70° C. while stirring. The reaction temperature was maintained at 70° C. for 22 hours. A portion of the Isopar ® G was distilled off under reduced pressure.

Imaging Example 1

Sodium stearate, 0.07 g (Pfaltz & Bauer, Inc.) was dissolved in 1.75 g of Zirconium Ten-Cem ® by stirring for 24 hours at room temperature. Zirconium Ten-Cem ® is a zirconium salt of neodecanoic acid and is available from OMG, Inc., Cleveland, Ohio. This mixture was added to 100 g of a 14% solids organosol dispersion in Isopar ® G, prepared above, and stirred at room temperature for 1 hour. This dispersion was diluted to 0.5% solids by further addition of Isopar ® G. This dispersion was then directly electrophoretically deposited onto 3M Brand Digital Matchprint Organic Photoconductor using a biased electrode at 500 volts potential and dried to coalesce the film. Coating thickness was 4 $\mu$m. 3M Brand Digital Matchprint SWOP/GAA Color Proofing inks were then used in the Digital Matchprint Color Proofing System Model 2700 to produce a full color halftone superposed image on the organosol coated photoconductor. The image and polymeric film were completely transferred from the photoconductor to plain, untreated printing paper by using a hot roller laminator at 160° C. and 60 psi pressure at a speed of 2.0 cm/second. A full color proof resulted. The image was scratch resistant and maintained a full halftone dot range of 1–98% dots at 150 line screen. The photoconductor could then be reused.

A similarly prepared full color image, prepared without the organosol polymeric layer, was incomplete and not scratch resistant.

Imaging Example 2

Sodium stearate, 0.07 g, (Pfaltz & Bauer, Inc.) was mixed with 1.75 g of Zirconium Ten-Cem® (OMG, Inc.) and added to 100 g of a 14% solids organosol dispersion in Isopar® G. The organosol was prepared as above, but without the attached charge coordinating sites. Imaging, development, and transfer of the image was carried out as described in Imaging Example 1 above. Loss of dot structure and sharpness was observed. The lack of coordination sites on the organosol results in free charges from the Zirconium Ten-Cem® and fewer charges on the organosol particles. Fewer charges on the organosol particle results in deposition of a thinner layer of organosol on the photoconductor and incomplete transfer of the image to plain paper.

Imaging Example 3

Zirconium Ten-Cem®, 1.75 g, (OMG, Inc.) alone was added to 100 g of a 14% solids organosol dispersion Isopar® G as prepared above. In this example, no charge dissipating agent (e.g., sodium stearate) was added. Imaging, development, and transfer of the image was carried out as described in Imaging Example 1 above. A very low optical density image was obtained due to lack of contrast in the latent image. This was due to the inability of the organosol to dissipate charge.

Imaging Example 4

Imaging Example 1 was repeated using Versatec SPC black premix liquid toner (available from Xerox Corp.). The toner was deposited over the organosol layer used in Example 1 above and directly transferred to primed polyester with 100% efficiency. Transmission optical density of over 3.5 was obtained with very sharp halftone dots.

An image prepared in a similar manner, but without the organosol polymeric layer on the photoconductor, was spotty and the image was more easily scratched.

Imaging Example 5

Imaging Example 1 was repeated using potassium oleate, 0.07 g, (Pfaltz & Bauer, Inc.) in place of sodium stearate. Imaging, development, and transfer of the image was carried out as described in Imaging Example 1 above. The image was scratch resistant and maintained a full halftone dot range of 1-98% dots at 150 line screen. The photoconductor could then be reused.

Imaging Example 6

The following example demonstrates the use of an anti gloss agent to the organosol. 3.6 g of fumed silica (Aerosil R-972, available from Degussa, Inc) was mixed with 100 g of 14% solids organosol dispersion prepared as in Imaging Example 1 above. 1.0 g of a 5% solution of potassium oleate in Zirconium Ten-Cem® was added and the mixture homogenized in a Silverson Mill for 1 hr. The dispersion was diluted to 0.5% solids by addition of Isopar® G, deposited on the photoreceptor, imaged, and transferred as in Imaging Example 1 above. The image showed surface texture and reduced gloss when compared to an image prepared without a matting agent.

Reasonable variations and modifications are possible from the foregoing disclosure without departing from either the spirit or scope of the present invention as defined in the claims.

We claim:

1. A proofing element consisting essentially of:
    (a) a photoconductive layer on an electrically conductive substrate; and
    (b) overlaying the photoconductive layer, a removable dielectric layer consisting essentially of: a coalesced film of thermoplastic polymeric resinous particles which have steric stabilizer groups adhered to the surfaces of said polymeric particles, said steric stabilizer groups being in coordinated association with a charge directing moiety and said charge directing moiety having a charge dissipating agent in association therewith.

2. The proofing element according to claim 1 wherein said photoconductive layer is organic.

3. The proofing element according to claim 1 wherein said charge directing moiety is a metal soap.

4. The proofing element according to claim 1 wherein said charge dissipating agent is a monovalent alkali metal cation or ammonium cation.

5. The proofing element according to claim 1 further containing a filler, extender, anti-gloss, or matting material.

6. A process for applying a removable dielectric layer to a photoconductive substrate consisting essentially of the steps of:
    (a) applying an organosol to a photoconductive substrate, the organosol consisting essentially of: a carrier liquid having a dispersion therein of thermoplastic polymeric resinous particles which have steric stabilizer groups adhered to the surfaces of said polymeric particles, said steric stabilizer groups being in coordinated association with a charge directing moiety and said charge directing moiety having a charge dissipating agent in association therewith; and
    (b) heating said organosol to remove said carrier liquid, thereby coalescing said thermoplastic polymeric resinous particles into a continuous film.

7. The process according to claim 6 wherein said organosol is applied to said photoconductive substrate by electrophoretic deposition.

8. The process according to claim 6 wherein said photoconductive layer is organic.

9. The process according to claim 6 wherein said charge directing moiety is a metal soap.

10. The process according to claim 6 wherein said charge dissipating agent is a monovalent alkali metal cation or ammonium cation.

* * * * *